United States Patent [19]
Understiller et al.

[11] Patent Number: 5,966,799
[45] Date of Patent: Oct. 19, 1999

[54] METHOD OF MOLDING FREE-FLOATING INSERT

[75] Inventors: Wade Norman Understiller, Mesa; Thomas Andrew Roche, Scottsdale; Ronald Dee Fuller, Mesa, all of Ariz.

[73] Assignee: Motorola, Inc., Schaumburg, Ill.

[21] Appl. No.: 08/831,118

[22] Filed: Apr. 1, 1997

[51] Int. Cl.⁶ .................................................. H01P 11/00
[52] U.S. Cl. ................ 29/600; 29/601; 29/827; 333/239
[58] Field of Search ............ 29/827, 600, 601; 333/239

[56] References Cited

U.S. PATENT DOCUMENTS 3,611,061  10/1971  Segerson.
3,899,305  8/1975  Hilgers et al. .
5,495,262  2/1996  Klebe ..................... 29/600 X
5,596,797  1/1997  Bumsted ................. 29/600 X

*Primary Examiner*—Carl J. Arbes
*Attorney, Agent, or Firm*—Bradley J. Botsch

[57] ABSTRACT

A method (60) for molding (67) a component (73) including a free floating insert (11). The method includes steps of providing an insert (11) including one or more weakened regions (23) coupled to a removable leader (20) and molding (67) a moldable compound (25) about the insert (11) and a portion of the removable leader (20). The method (60) further includes a step of pulling (69) on the removable leader (20) to fracture the weakened regions (23) and thereby detach the removable leader (20) from a molded component (73) including the insert (11) therein. The molding step (67) desirably includes a step of injection molding (67) a thermoplastic material (25) about the insert (11) and the portion of the removable leader (20).

16 Claims, 2 Drawing Sheets

METHOD OF MOLDING FREE-FLOATING INSERT

FIELD OF THE INVENTION

This invention relates in general to the field of injection molding, in particular to injection molding of components having inserts and more particularly to an improved process for making an injection molded part including an insert.

BACKGROUND OF THE INVENTION

Injection molding of plastic parts is important for many electronic products. However, especially when other components must be included entirely within an injection molded part, or have portions projecting from only one face of an injection molded part, process complexity is increased and additionally the equipment required to make the part is substantially more complex than is required, for example, to injection mold a package about a conventional lead frame, which includes portions projecting from either side of the mold. Prior art approaches suffer from lack of flexibility and either require pins, which are removed during the molding process, or a two-step molding process. When the moveable pin approach is used, it may leave openings that may require backfilling. It has been especially uneconomical and impractical to provide for inserts that do not extend to the surface of the molded part.

Thus, what is needed is a practical, economical method for holding an insert that is to be contained entirely within a molded component, particularly when the insert does not extend from one side of the molded part to another.

DETAILED DESCRIPTION OF THE DRAWINGS

As used herein, the term "injection molding" includes other types of molding (e.g., transfer molding, compression molding) and may be carried out with a broad variety of materials, including but not limited to thermoplastic materials, thermosetting plastic materials, metals or for that matter candle wax. The term "injection molding" is used throughout for simplicity of explanation and ease of comprehension with the understanding that any of these other processes and/or materials are included within the ambit of the disclosure and claims.

Figure 1:
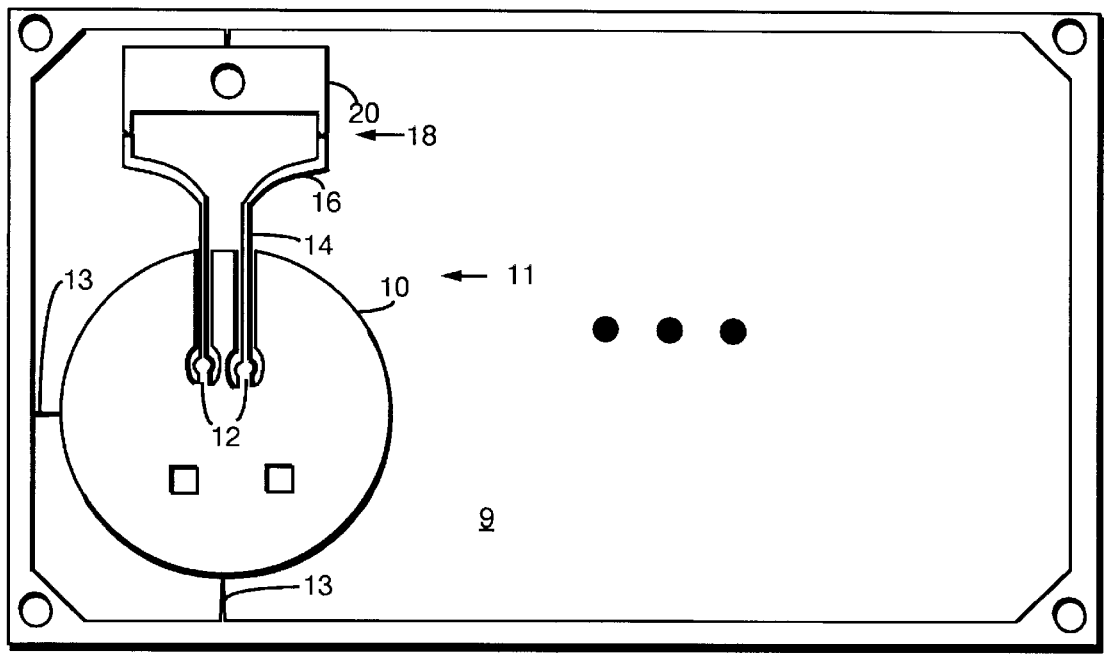
FIG. 1 shows a simplified plan view of a stamping for an insert for an injection molded part, in accordance with the teachings of the instant invention.

FIG. 1 shows a simplified plan view of stamping 9 for insert 11 for injection molded part 73 (FIG. 7), in accordance with the teachings of the instant invention. Stamping 9 includes antenna base 10 secured to lead frame 8 via supports 13, antennae 16 secured to posts 14 and thence to antenna base 10 via supports 12 and removable leader 20 coupled to each of antennae 16 via region 18.

While stampings 9 may be formed by a variety of processes (e.g., chemical milling), mass production tends to favor simple and reliable processes such as stamping. Stampings 9 may be usefully fashioned from a broad variety of materials, such as metals, ceramics, glasses or plastics, provided that the materials (i) do not react in an untoward fashion with molding material 25 (see FIGS. 2–5 and 7) and (ii) do not melt or lose dimensional stability in an untoward fashion when exposed to the temperatures and pressures encountered in molding the molding material.

Figure 2:
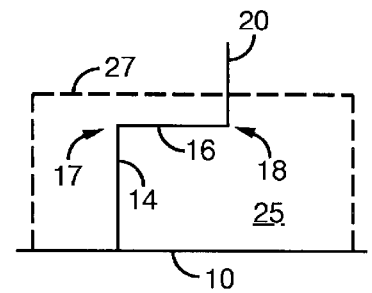
FIG. 2 illustrates bending of portions of the stamping prior to injection molding, in accordance with the teachings of the instant invention.

FIG. 2 illustrates bending of portions of stamping 9 prior to injection molding, in accordance with the teachings of the instant invention. In production, support 13 coupling removable leader 20 to lead frame 8 is sheared when removable leader 20, antennae 16 and posts 14 are first bent at supports 12 to form a right angle with base 10. Antennae 16 and removable leader 20 are then bent to be parallel to and disposed over base 10 by bending at right angles at the tops of posts 14, i.e., at regions 17. Removable leader 20 is then bent at right angles to antennae 16 by bending at regions 18 away from base 10 as shown in FIG. 2. Following injection molding of plastic material 25 about portions of base 10, posts 14, antennae 16 and portions of removable leader 20, removable leader 20 is removed as described below in connection with FIGS. 3–5.

Figure 3:
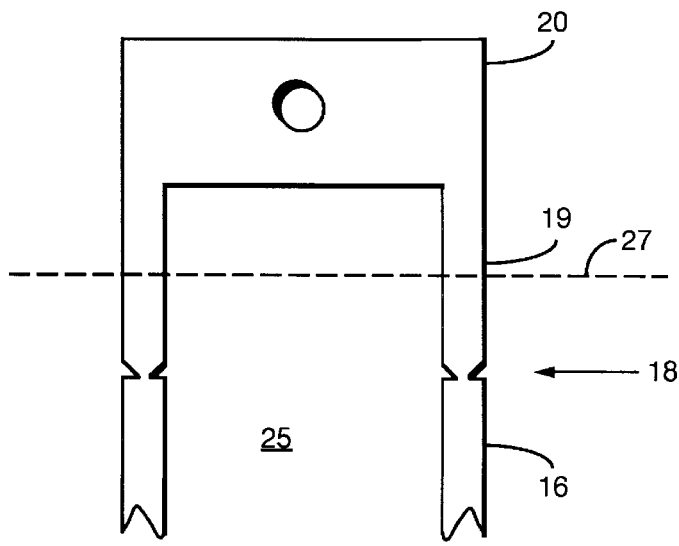
FIG. 3 shows an enlarged and simplified view of a portion of the removable leader and a portion of an injection molded component, in accordance with the teachings of the present invention.

FIG. 3 shows an enlarged and simplified view of a portion of removable leader 20 and portion 25 of an injection molded component, in accordance with the teachings of the present invention. Shank 19 couples removable leader 20 to antennae 16 via regions 18 disposed within molded plastic 25, below surface 27 of molded plastic 25. Removable leader 20 extends outside of molded plastic 25.

Figure 4:
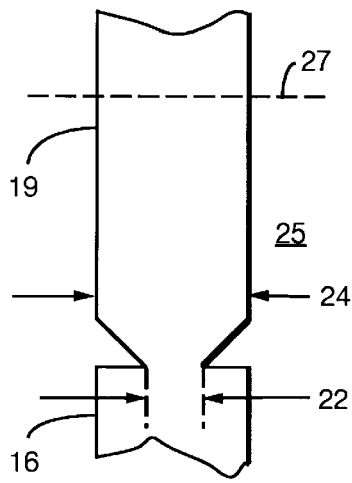
FIG. 4 shows an enlarged and simplified view of a portion of the shank and a portion of the injection molded component, in accordance with the teachings of the present invention.

FIG. 4 shows an enlarged and simplified view of a portion of shank 19 and portion 25 of the injection molded component, in accordance with the teachings of the present invention. Shank 19 extends through surface 27 of molded plastic 25 and includes first section 29 having dimension 24 and second section 23 having dimension 22. Second section 23 has a crosssectional area chosen to provide a tensile strength that is substantially reduced compared to other portions of removable leader 20 and shank 19, i.e., the cross sectional area of second section 23 is substantially less than that of other portions of removable leader 20 and shank 19. In this example, the controlled and localized reduction of tensile strength is aided by introducing a right angle bend in region 18 in the neighborhood of or at second section 23. Removal of removable leader 20 and shank 19 is described in conjunction with FIG. 5 below.

Figure 5:
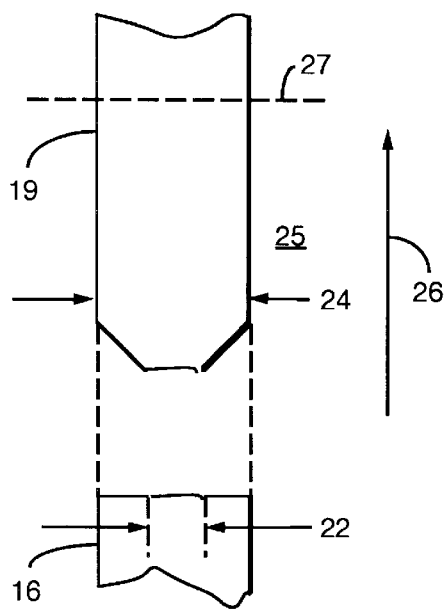
FIG. 5 shows an enlarged and simplified view of a portion of the shank and a portion of the injection molded component, illustrating removal of the leader from the molded component, in accordance with the teachings of the present invention.

FIG. 5 shows an enlarged and simplified view of a portion of shank 19 and portion 25 of the injection molded component, illustrating removal of leader 20 from injection molded component 25, in accordance with the teachings of the present invention. Pulling with a force exceeding the predetermined tensile strength of second section 23 on removable leader 20 and shank 19 as indicated by direction arrow 26 causes second section 23 to rupture, allowing removable leader 20 and shank 19 to be detached from the injection molded component. Base 10 may be detached from lead frame 11 by severing any remaining supports 13 and any runner (excess plastic that is an artifact of the molding process) may be trimmed from the molded component to provide a component that is detached from other components and from excess material.

Further processing severs supports 12 to electrically isolate antennae 16 from each other and prepares the bases of posts 14 for facilitating electrical interconnection to external circuitry. In one application, such molded components 73 (FIG. 7) are assembled together to provide a phased array antenna operating in the region of 14 gigahertz.

Figure 6:
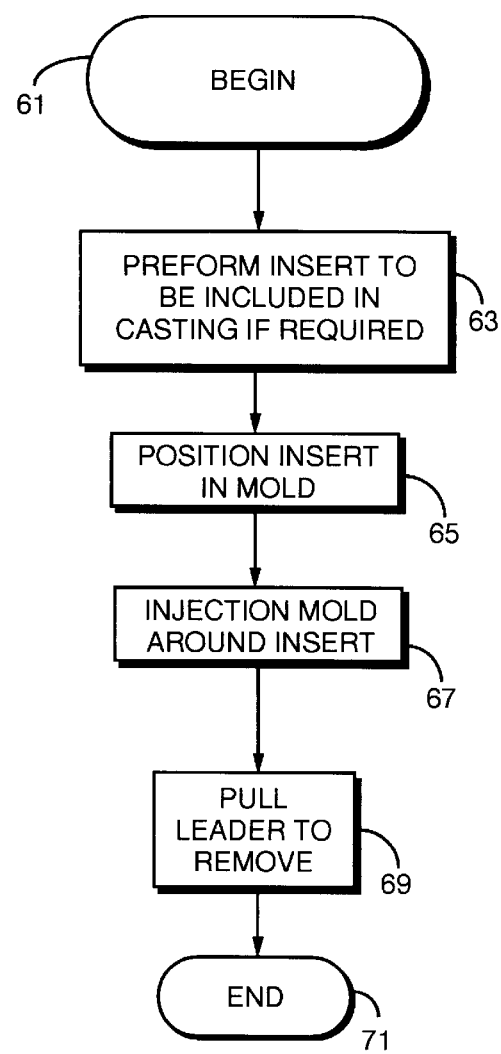
FIG. 6 is a flow chart illustrating steps in the injection molding of a part including an insert, in accordance with the teachings of the instant invention.

FIG. 6 is a flow chart illustrating steps in the injection molding of a part including insert 11, in accordance with the teachings of the instant invention. Process 60 begins (block 61) with preforming of insert 11 (Block 63) including any bending that may be required, and also including formation of first 29 and second 23 sections as required. Insert 11 is positioned (block 65) in a mold (not illustrated) and is molded into the material being molded (block 67). The injection molded part is then removed from the mold and removable leader 20 is pulled (block 69) to detach removable leader 20 and shank(s) 19 from the molded component. Process 60 then ends (block 71) and any other steps may take place (e.g., removal of any runner from the molding process, severance of items such as supports 12, trimming of the molded component and the like). If desired or required, any opening remaining following removal of removable leader 20 and shank(s) 19 may be filled with either the same material as comprises molded material 25 or a different material.

Figure 7:
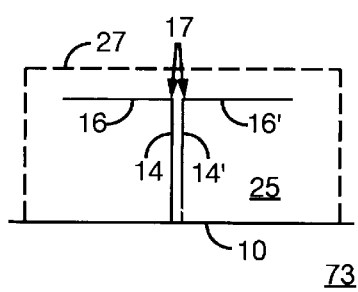
FIG. 7 shows a simplified and enlarged view of an antenna made in accordance with the teachings of the present invention.

FIG. 7 shows a simplified and enlarged view of antenna 73 made in accordance with the teachings of the present invention. Antenna 73 is illustrated in FIG. 7 after removal of removable leader 20 and severing of supports 12, and shows that posts 14, 14' support antennae 16, 16' suspended within molded material 25 and disposed atop base 10.

EXAMPLE

In an application for a phased array antenna operating in the 14 gigahertz region, a KOVAR™ insert 11 is required in an injection-molded component usefully comprising Ryton R902 ceramic- and glass-filled polyphenlylene sulfite or ULTEM 1010 or 2110 thermoplastic material, available from General Electric Co. In this application a width of 0.38 mm (0.015") and a breadth of 0.18 mm (0.007") is selected for neck 23. Since KOVAR alloy has a tensile strength leading to rupture at 5,277 kg/cm$^2$ (75,000 pounds per square inch), fracture of shank 19 at neck 23 requires a pull of about 3.575 kg (8 lbs.).

In an application for an RF antenna operating in the 10 megahertz region, a copper 194 alloy, half hard, insert 11 is required to be injection molded, encapsulating insert 11 within materials 25 such as Vectra C130A, a glass filled liquid crystal polymer, available from Celanese Corporation of Summit, N.J. or Noryl 731, a polyphenyleneoxide thermoplastic material, available from, General Electric Corporation, Plastics Group of Selkirk, N.Y. In this application, using FIG. 4, a diameter of 1.6 mm (0.063") is selected for shank 19, and a diameter of 0.51 mm (0.020") is selected for neck 23. Since copper 194 has a tensile strength leading to rupture at 3,515 kg/cm$^2$ (50,000 pounds per square inch), fracture of shank 19 at neck 23 requires a pull of about 7.264 kg (16 pounds).

These examples use molding materials that initially comprise pelletized thermoplastic materials that are heated to melting or to a semi-liquid state in a screw or pot machine and that are then injected into the mold at pressures of up to 2,211 to 2,948 kg/cm$^2$ (30,000 to 40,000 psi).

In these examples, dimensional control of boundaries 27 (see FIGS. 2–5 and 7) was required to be maintained to a tolerance of +/−25 micrometers (one mil) and posts 14, 14' were required to maintain a positional tolerance of +/−75 micrometers (three mils). The requirement on positional tolerance on posts 14, 14' meant that a thicker (i.e., more viscous) plastic (e.g., ULTEM 1000) could not be used with Cu or BeCu stampings 11 because they would not be able to hold their shape adequately during the molding process.

Thus, an injection molding process and the product made thereby has been described which overcomes specific problems and accomplishes certain advantages relative to prior art methods and mechanisms. The improvements over known technology are significant. The expense, complexities, and high labor content of prior art approaches are avoided. While the examples given included a second region or neck 23 having a reduced diameter compared to other portions of insert 11, it will be appreciated that other methods (e.g., holes, differences in composition etc.) may be employed to provide a weakened section 23 at which fracture will preferentially occur in response to tensile extension, e.g., by pulling on removable leader 20.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. A method for molding a component including a free floating insert coupled to only one surface of said component, said method comprising steps of:

providing an insert including at least one weakened region coupled to a removable leader; said removable leader including at least one shank comprising a first segment and a second segment whereby a first end of said first segment is coupled to said weakened region of said insert;

molding a moldable compound about said insert and said first segment of said at least one shank of said removable leader whereby said second segment of said at least one shank is not within said moldable compound; and linearly pulling on said removable leader to fracture said at least one weakened region and thereby detach said removable leader from said insert at a location or locations within a molded component including said insert therein such that said insert is fully encapsulated in said moldable compound.

2. A method as claimed in claim 1, wherein said molding step includes a step of injection molding a thermoplastic material about said insert and said first segment of said at least one shank of said removable leader.

3. A method as claimed in claim 1, wherein said molding step includes a step of transfer molding a thermosetting plastic material about said insert and said first segment of said at least one shank of said removable leader.

4. A method as claimed in claim 1, wherein said step of providing an insert includes the steps of stamping said insert to provide a stamped shape in a piece of sheet metal and bending said stamped shape at selected locations to form said three-dimensional, free floating insert and said removable leader.

5. A method as claimed in claim 1, wherein said step of providing an insert includes a step of providing an insert fashioned from a material chosen from a group consisting of: metal, sheet metal, glass, ceramic and plastic materials.

6. A method as claimed in claim 1, further comprising a step of trimming said molded material to remove artifacts from said molding step and from detaching said removable leader from said molded component.

7. A method of making an element of an antenna, said element of an antenna including a free floating insert coupled to only one surface of said element of an antenna, said method comprising steps of:

providing an insert including at least one weakened region coupled to a removable leader;

said removable leader including at least one shank comprising a first segment and a second segment whereby a first end of said first segment is coupled to said weakened region of said insert; and molding a moldable compound about said insert and said first segment of said at least one shank of said removable leader whereby said second segment of said at least one shank is not within said moldable compound.

8. A method as claimed in claim 7, further comprising a step of linearly pulling on said removable leader to fracture said at least one weakened region and thereby detach said removable leader from said insert at a location or locations within said element of an antenna including said insert therein such that said insert is fully enveloped in said moldable compound.

9. A method as claimed in claim 7, wherein said step of providing an insert includes a step of providing an insert including at least one weakened region coupled to a removable leader, wherein said at least one weakened region comprises at least one region of reduced cross-sectional area, said reduced cross-sectional area chosen to provide a predetermined tensile strength of sufficient weakness to allow removal of said removable leader by a step of linear pulling.

10. A method as claimed in claim 7, wherein said step of providing an insert includes steps of:

stamping aid insert from a sheet of sheet metal;

first bending a first portion of said insert to provide posts extending away from a base;

second bending a second portion of said insert to provide antenna radiating elements disposed away from and substantially parallel to said base, each of said antenna radiating elements supported at a proximal end thereof by one of said posts; and third bending a third portion of said insert to provide a removable leader extending from distal portions of said antenna radiating elements.

11. A method as claimed in claim 10, wherein said step of third bending includes bending a third portion of said insert wherein said third portion includes said at least one weakened region.

12. A method as claimed in claim 9, wherein said step of providing an insert includes steps of:

stamping said insert from a sheet of sheet metal;

first bending a first portion of said insert to provide posts extending away from a base;

second bending a second portion of said insert to provide antenna radiating elements disposed away from and substantially parallel to said base, each of said antenna radiating elements supported at a proximal end thereof by one of said posts; and third bending a third portion of said insert to provide a removable leader extending from distal portions of said antenna radiating elements.

13. A method as claimed in claim 12, wherein said step of third bending includes bending a third portion of said insert wherein said third portion includes said at least one region of reduced cross-sectional area.

14. A method as claimed in claim 7, wherein said molding step includes a step of injection molding a thermoplastic material about said insert and said first segment of said shank of said removable leader.

15. A method as claimed in claim 12, wherein said stamping step includes a step of stamping said insert from a sheet of sheet metal, wherein said sheet metal is chosen from a group consisting of: stainless steel, ferrous alloys, aluminum, copper, gold, nickel, silver, copper alloys and nonferrous alloys.

16. A method of making an element for an antenna, said method comprising steps of:

stamping an insert from a sheet of sheet metal, said insert including one or more weakened regions coupled to a removable leader, wherein said one or more weakened regions comprise regions of reduced cross-sectional area, said reduced cross-sectional area chosen to provide a predetermined tensile strength;

first bending a first portion of said insert to provide posts extending away from a base;

second bending a second portion of said insert to provide antenna elements disposed away from and substantially parallel to said base, each of said antenna portions supported at a proximal end thereof by one of said posts;

third bending a third portion of said insert to provide a removable leader extending from distal portions of said antenna elements, wherein said third portion includes said regions of reduced cross-sectional area;

injection molding a thermoplastic material about said insert and a portion of said removable leader; and pulling on said removable leader to fracture said one or more weakened regions and thereby detach said removable leader from a molded component including said insert therein.

* * * * *